United States Patent
Pozidis et al.

(10) Patent No.: US 8,395,877 B2
(45) Date of Patent: Mar. 12, 2013

(54) HIGH-SPEED ELECTROSTATIC ACTUATION OF MEMS-BASED DEVICES

(75) Inventors: Charalampos Pozidis, Thalwil (CH); Angeliki Pantazi, Thalwil (CH); Abu Sebastian, Adliswil (CH); Deepak Ranjan Sahoo, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 973 days.

(21) Appl. No.: 12/370,356

(22) Filed: Feb. 12, 2009

(65) Prior Publication Data

US 2010/0201289 A1    Aug. 12, 2010

(51) Int. Cl.
*G02B 26/00*    (2006.01)
*G02B 26/02*    (2006.01)

(52) U.S. Cl. ......... 361/233; 361/211; 359/291; 359/295
(58) Field of Classification Search .................. 361/211, 361/233; 359/291, 295
See application file for complete search history.

(56) References Cited

U.S. PATENT DOCUMENTS

| | | | | |
|---|---|---|---|---|
| 4,441,791 A * | 4/1984 | Hornbeck | | 359/295 |
| 5,096,279 A * | 3/1992 | Hornbeck et al. | | 359/230 |
| 5,280,277 A * | 1/1994 | Hornbeck | | 345/108 |
| 5,382,961 A * | 1/1995 | Gale, Jr. | | 345/108 |
| 5,386,250 A * | 1/1995 | Guerinot | | 348/770 |
| 5,444,566 A * | 8/1995 | Gale et al. | | 359/291 |
| 5,706,123 A * | 1/1998 | Miller et al. | | 359/291 |
| 5,768,007 A * | 6/1998 | Knipe et al. | | 359/290 |
| 5,912,758 A * | 6/1999 | Knipe et al. | | 359/290 |
| 7,158,281 B2 * | 1/2007 | Chen et al. | | 359/291 |
| 7,508,569 B2 * | 3/2009 | Pan et al. | | 359/290 |

OTHER PUBLICATIONS

Batra, R., Review of Modeling Electrostatically Actuated Microelectromechanical Systems. Smart Materials and Structures, vol. 16, No. 6, Oct. 2007. pp. R23-R31. (9 pgs.).

* cited by examiner

*Primary Examiner* — Rexford Barnie
*Assistant Examiner* — Zeev V Kitov
(74) *Attorney, Agent, or Firm* — Tutunjian & Bitetto, P.C.; Anne V. Dougherty

(57) ABSTRACT

A micro-electro mechanical device includes a first structure, a second structure offset from the first structure by a gap. The first structure is configured to be electrostatically actuated to deflect relative to second structure. A pulse generator is configured to combine at least two different pulses to electrostatically drive at least one of the first structure and the second structure between an initial position and a final position.

21 Claims, 6 Drawing Sheets

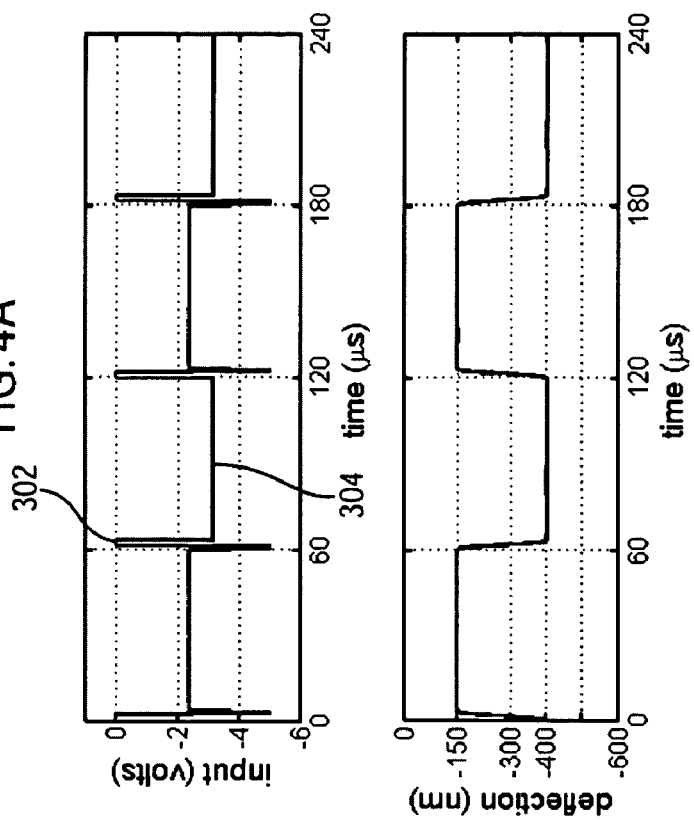
FIG. 4A
FIG. 4B
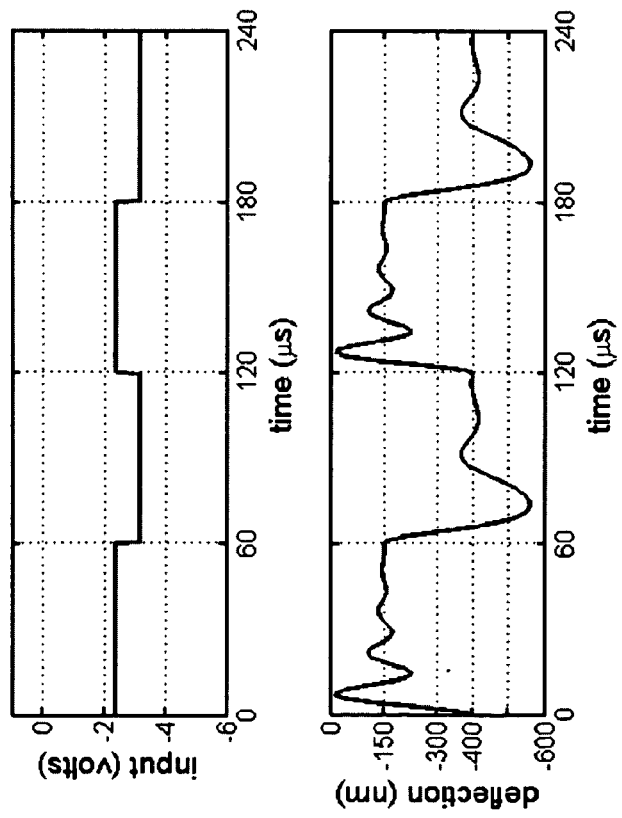
FIG. 3A
FIG. 3B

HIGH-SPEED ELECTROSTATIC ACTUATION OF MEMS-BASED DEVICES

BACKGROUND

1. Technical Field

The present invention relates to actuation of nano, micro-electromechanical (MEM) devices, and more particularly to systems and method for improving response time of MEMs devices by shaping control pulses.

2. Description of the Related Art

For actuation of Micro-electromechanical Systems (MEMS)-based devices, electrostatic voltage is applied conservatively. Electrostatics is a preferred mode of actuation in micro-electro-mechanical-systems (MEMS)-based devices. However, the dynamics of the devices become nonlinear with this actuation scheme. Nonlinear dynamics pull-in instability occurs beyond the travel distance of one third of an initial gap between microstructures. For example, a parallel plate MEMS structure moves nonlinearly in response to an applied input voltage and may cause the electrostatically charge parts to collapse into each other. For simplicity, typically small magnitude, long time-scale step or sinusoid voltage waveforms are applied to these devices. These devices are operated very slowly compared to their achievable speed so as to avoid nonlinear transient responses. High demand on increased speed of operation of electrostatic micro-systems has made the slow and methodical motion of MEMS undesirable in many applications.

SUMMARY

A micro-electro mechanical device includes a first structure, a second structure offset from the first structure by a gap. The first structure is configured to be electrostatically actuated to deflect relative to second structure. A pulse-generator is configured to combine at least two different pulses to electrostatically drive at least one of the first structure and the second structure between an initial position and a final position.

Another device includes an array of micro-electro mechanical devices. The device is an integrated circuit having a plurality of micro-electro mechanical devices formed thereon. The micro-electro mechanical devices include a first structure, a second structure offset from the first structure by a gap wherein the first structure is configured to be electrostatically actuated to deflect relative to second structure, and a pulse generator configured to combine at least two different pulses to electrostatically drive at least one of the first structure and the second structure between an initial position and a final position. A controller is configured to control activation of the plurality of micro-electro mechanical devices.

A method for actuating a micro-electromechanical device includes pulse shaping an input voltage using a pulse shaper configured to combine at least two different pulses to apply to at least one of a first structure and a second structure of the device, and applying the at least two different pulses to electrostatically drive at least one of the first structure and the second structure between an initial position and a final position.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 3A is a plot of an illustrative input voltage signal with respect to time without pulse shaping;

FIG. 3B is a plot of deflection versus time responsive to the input voltage as depicted in FIG. 3A;

FIG. 4A is a plot of an illustrative input voltage signal with respect to time with pulse shaping in accordance with the present principles;

FIG. 4B is a plot of deflection versus time responsive to the input voltage as depicted in FIG. 4A showing transients reduced or eliminated in accordance with the present principles;

DETAILED DESCRIPTION OF PREFERRED EMBODIMENTS

Figure 1A:
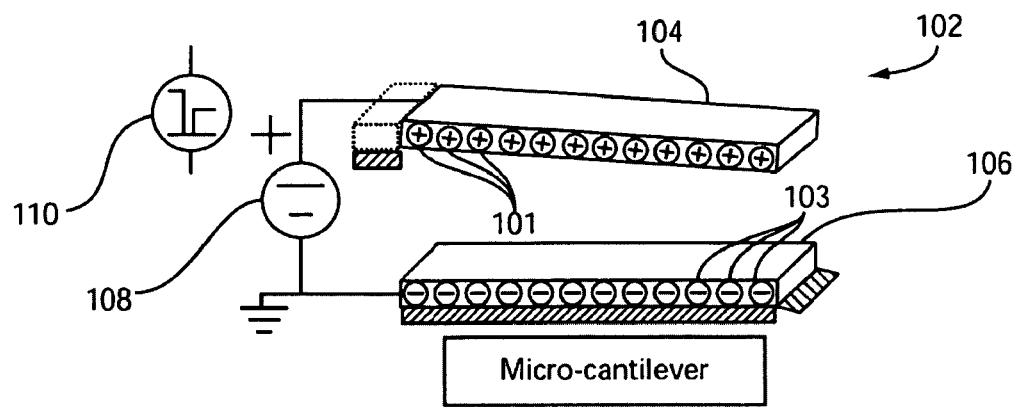
FIG. 1A is a perspective view of a Micro-electromechanical Systems (MEMS)-based device in the form of a micro-cantilever actuated in accordance with the present principles.

The present principles include a novel shaping scheme of applied input voltages which provides ultrafast response of micro-electro-mechanical system (MEMS) devices. The present principles employ optimal control theory for control of electrostatically actuated MEMS devices-type nonlinear systems. The present embodiments illustratively describe a methodology to generate an input voltage signal to drive a MEMS structure from an initial position to a final position exponentially fast. The final velocity of zero is reached exponentially fast, and the final position is maintained as long as desired.

In one example, the input signal includes two pulses (or more) whose magnitudes are equal to either the maximum or the minimum of the permitted input voltage, followed by an equilibrium voltage corresponding to a final position of the device. The first pulse is selected so that the structure moves towards the final position when it is applied. A switching time of the pulses is such that the structure moves towards the final position while the velocity reduces to zero when the final position is reached. Switching times are preferably kept to a minimum (as few as needed). The final voltage is set to the equilibrium voltage corresponding to that of the final position of the device for as long as that position is desired to be maintained.

Embodiments of the present invention can take the form of an entirely hardware embodiment, an entirely software embodiment or an embodiment including both hardware and software elements. In a preferred embodiment, the present invention is implemented in hardware having software elements, which may include but are not limited to firmware, resident software, microcode, etc.

Furthermore, the invention or a portion thereof can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory IRAN), a read-only memory (ROM), a rigid magnetic disk and an optical disk. Current examples of optical disks include compact disk-read only memory (CD-ROM), compact disk-read/write (CD-RAW) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

MEMS devices and controls circuitry may be implemented as part of the design for an integrated circuit chip. The chip design is created in a graphical computer programming language, and stored in a computer storage medium (such as a disk, tape, physical hard drive, or virtual hard drive such as in a storage access network). If the designer does not fabricate clips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the clip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1B:
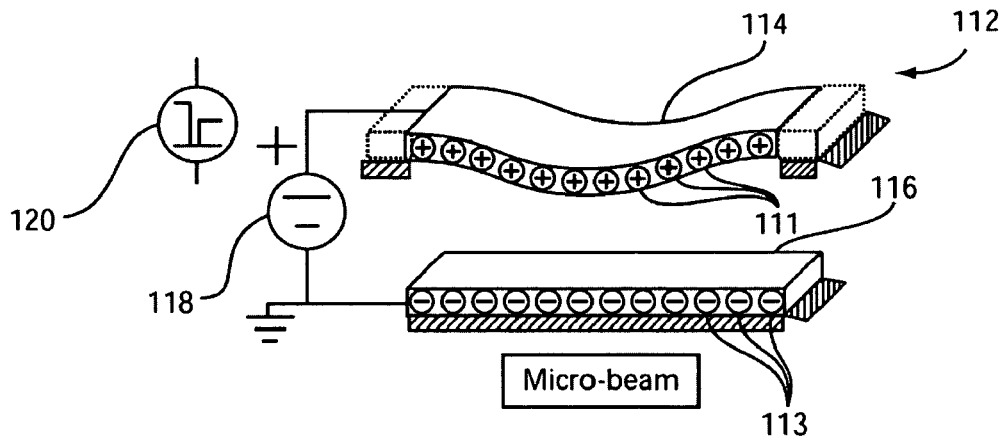
FIG. 1B is a perspective view of a Micro-electromechanical Systems (MEMS)-based device in the form of a micro-beam actuated in accordance with the present principles.
Figure 1C:
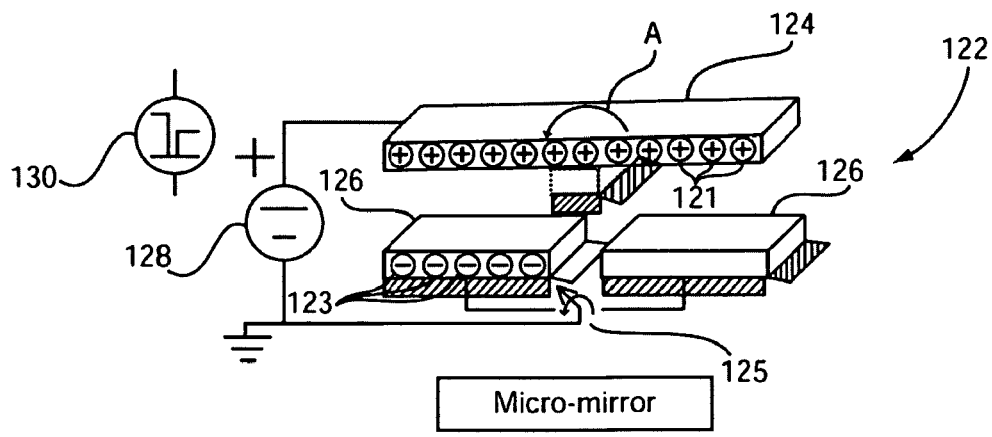
FIG. 1C is a perspective view of a Micro-electromechanical Systems (MEMS)-based device in the form of a micro-mirror actuated in accordance with the present principles.

Referring now to the drawings in which the numerals represent the same or similar elements and initially to FIGS. 1A-1C, perspective views of three illustrative MEMS devices 102, 112 and 122 are illustratively depicted to demonstrate the present principles. FIG. 1A shows a micro-cantilever structure 102 where a cantilever 104 is deflected toward or away from a base structure 106 in accordance with the electrostatic charge 101 and 103 applied to cantilever 104 and/or base structure 106 across a power source 108. A pulse shaper or pulse generator 110 is employed in accordance with one embodiment to apply the electrostatic charge (101/103) to the cantilever 104 and/or base structure 106 in accordance with the present principles. The pulse shaper 110 may include one or more stored pulse shapes that are applied to the MEMS 102 to provide a desired motion of the cantilever 104 relative to the base structure 106. In one embodiment, the pulse shaper 110 applies or generates an input voltage signal to drive the MEMS structure 102. The input signal includes two or more pulses whose magnitudes are equal to either the maximum or the minimum of die allowed input voltage followed by an equilibrium voltage $V_{EQ}$ corresponding to the final position of the device. Switching times of the pulses are such that the velocity of the structure initially increases from zero and then reduces to zero when the final position is reached. The number of switching tines is as few as needed. Position and velocity change exponentially during the process. The final position is maintained after zero velocity is again achieved in accordance with the applied pulse by applying $V_{EQ}$.

FIG. 1B shows a micro-beam structure 112 where a beam 114 is deflected toward or away from a base structure 116 in accordance with the electrostatic charge 111 and 113 applied to beam 114 and/or base structure 116 across a power source 118. A pulse shaper 120 is employed in accordance with one embodiment to apply the electrostatic charge (111/113) to the beam 114 and/or base structure 116 in accordance with the present principles. The pulse shaper or generator 120 may include one or more stored pulse shapes that are applied to the MEMS 112 to provide a desired motion of the beam 114 relative to the base structure 116. In one embodiment, the pulse shaper 120, as before, applies or generates an input voltage signal to drive the MEMS structure 112. The input signal includes two or more pulses whose magnitudes are equal to either the maximum or the minimum of the allowed input voltage followed by an equilibrium voltage $V_{EQ}$ corresponding to the final position of the device. Switching times of the pulses are such that the velocity of the structure initially increases from zero and then reduces to zero when the final position is reached. The number of switching times is as few as needed. Position and velocity change exponentially during the process. The final position is maintained after zero velocity is again achieved in accordance with the applied pulse by applying $V_{EQ}$.

Electrostatic force is an attractive force which is independent of the sign of the voltage signal or charge applied to individual MEMS structures. It is a nonlinear function of the instantaneous potential difference and the separation between the micro-structures. The maximum and minimum input for electrostatic actuation is described as follows. For example, in the micro-cantilever structure 102, the maximum input corresponds to the maximum of the absolute of the input voltage source, and the minimum input corresponds to zero voltage. In the case of a micro-mirror 122 or two-way micro-switch, etc., the maximum and minimum inputs correspond to the maximum absolute input voltage and zero voltage applied to one of the base structures 126 and then the other, respectively. When the first pulse is applied, the position and velocity of the moving structure increases exponentially fast which is the maximum achievable rate. When the second pulse is applied, the position and velocity reduce exponentially fast to the desired position and zero velocity. The final position is maintained by applying equilibrium voltage $V_{EQ}$.

An electromechanical model of the micro-structure, which is a nonlinear model, is simulated in order to obtain the switching times or the rules for the applied pulses. For small movements of the MEMS devices, a linear model can be obtained near the operating region of the device and the switching times can be obtained from time-optimal control theory. A comprehensive electromechanical model of the MEMS device with the actuation electronics comprising amplifiers and filters can be considered for an accurate selection of switching times. The power sources used for electrostatic actuation of MEMS devices encompasses voltage, current and charge sources.

FIG. 1C shows a micro-mirror structure 122 where a mirror 124 is rotationally deflected toward or away (as indicated by arrow A) from a charged base structure 126 in accordance with the electrostatic charge 121 and 123 applied to mirror 124 and/or one of the base structures 126 across a power source 128. A switch 125 is controlled to activate one of the base structures 126 to permit the mirror to be rotated toward (or away) from one of the base structures 126. A pulse shaper or pulse generator 130 is employed in accordance with one embodiment to apply the electrostatic charge (121/123) to the mirror 124 and/or one base structure 126 in accordance with the present principles. The pulse shaper 130 may include one or more stored pulse shapes that are applied to the MEMS 122 to provide a desired motion of the mirror 124 relative to the base structure 126. In one embodiment, the pulse shaper 130 applies or generates an input voltage signal to drive the MEMS structure 122. The input signal includes two or more pulses whose magnitudes are equal to either the maximum or the minimum of the allowed input voltage followed by an equilibrium voltage $V_{EQ}$ corresponding to die final position of the device. Switching times of the pulses are such that the velocity of the structure initially increases from zero and then reduces to zero when the final position is reached. The number of switching times is as few as needed. Position and velocity change exponentially during the process. The final position is maintained after zero velocity is again achieved in accordance with the applied pulse by applying $V_{EQ}$.

In accordance with the present principles, micro-cantilevers (e.g., for high-speed interrogation of surfaces with low forces), micro-beams, micro-mirrors (e.g., for high-speed digital light processing) are illustratively depicted. Other structures may also be employed in accordance with the present principles. E.g., micro-switches for high-speed operation needed in wireless communication, micro-pumps, micro-grippers, micro-valves, etc. may be employed.

Figure 2:
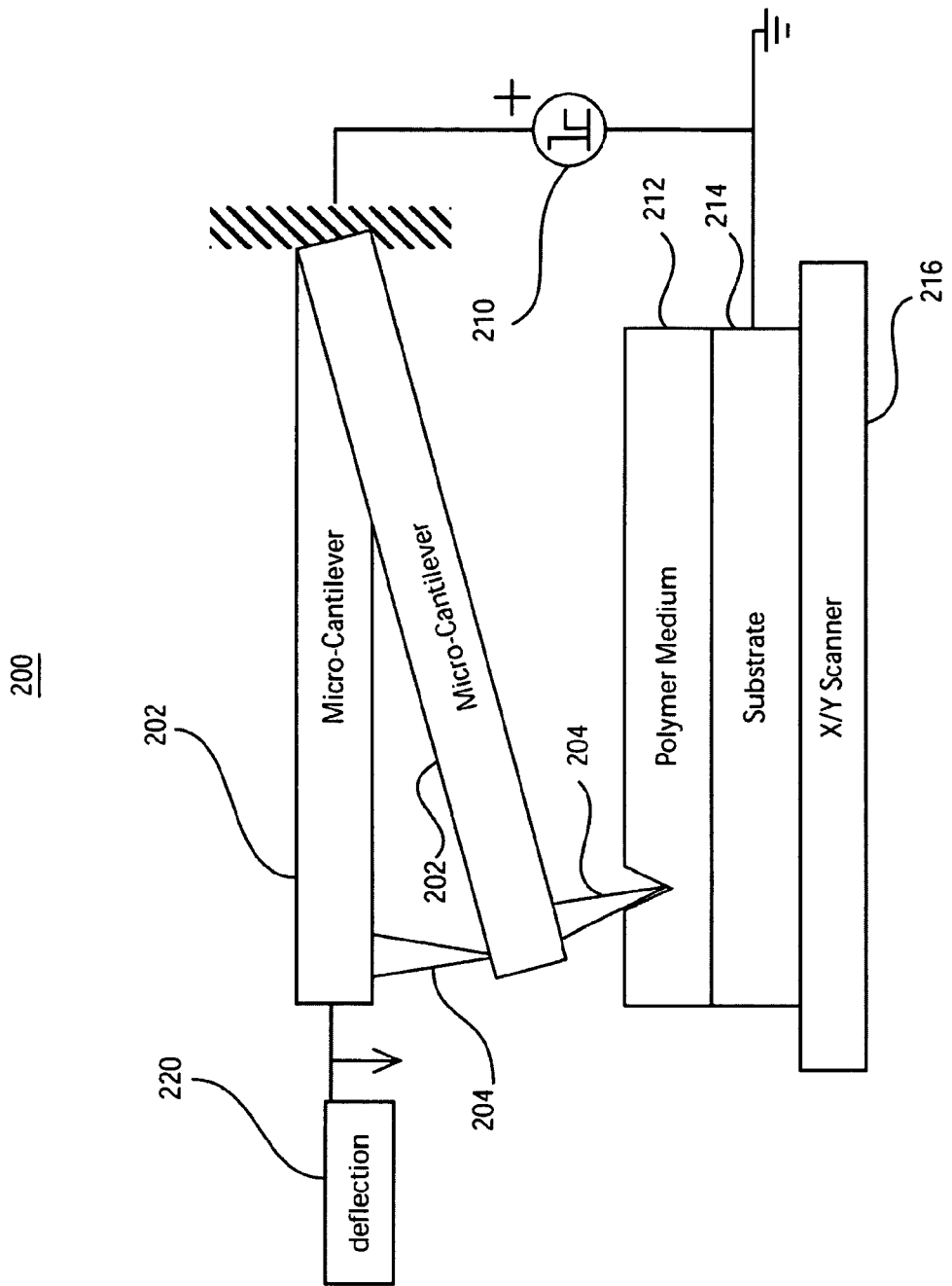
FIG. 2 is a side view showing of a micro-cantilever deflecting from a first position to a second position using a pulse shaper in accordance with the present principles.

Referring to FIG. 2, a MEMS 200 in accordance with one illustrative embodiment shows an experimental setup employed to demonstrate the present principles. MEMS 200 includes a micro-cantilever 202 actuated using electrostatic charge. A pulse shaper 210 is employed to input voltage pulses for controlling a deflection 220 of the micro-cantilever 202. Electrostatic charge is controlled between the micro-cantilever 202 and a substrate 214. A polymer medium 212 is provided to contact a tip 204 of the micro-cantilever 202. For the parallel plate (cantilever-substrate)-type MEMS device employed in the experiment, the resonant frequency, f0=80 kHz and a Quality factor, Q=3.2.

Referring to FIGS. 3A and 3B, an input signal (FIG. 3A) is depicted which causes the deflection as shown in FIG. 3B. The input signal is a square wave which results in a deflection signal that includes transients and oscillations. As illustrated, the MEMS 200 needs approximately 60 μs to deflect 250 nm. The deflection is asymmetric due to nonlinearity.

Referring to FIGS. 4A and 4B, an input signal FIG. 4A) from pulse shaper 210 includes a first pulse 302 and a second pulse 304. The first and second pulses 302 and 304 cause the deflection as shown in FIG. 4B in accordance with the present principles. The multiple pulse input signal results in a deflection signal that eliminates transients and oscillations. As illustrated, the MEMS 200 needs approximately 3 μs to deflect 250 nm. The deflection is symmetric despite nonlinearities, and the transients are reduced or eliminated. Advantageously, more than an order or magnitude improvement in time is achieved for open-loop positioning.

Figures 5A, 5B:
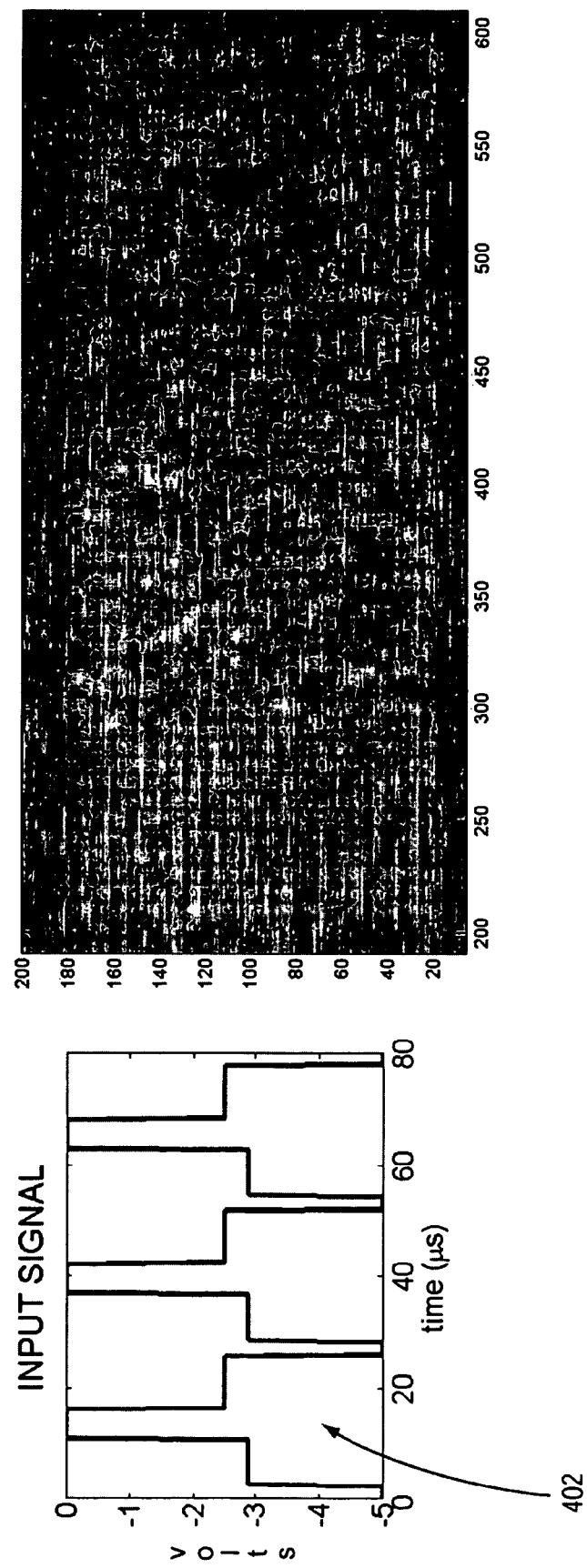
FIG. 5A is a plot of an illustrative input voltage signal with respect to time using pulse shaping for intermittent contact (tapping) for a data storage application in accordance with the present principles.
FIG. 5B is a probe-based data storage surface programmed (using surface craters) using the device in FIG. 2.

Referring to FIGS. 5A and 5B, an input signal 402 is illustratively depicted for an intermittent-contact (tapping) reading application in probe-based data storage. This application provides high signal integrity (i.e., SNR) at high data-rates. For example, a tapping frequency using standard square-wave input=25 kHz, whereas a tapping frequency using (sub-optimal) pulse-shaping is accordance with the present principles achieves 40 kHz or greater. FIG. 5B shows an image of the data storage medium obtained by the tapping process (see also FIG. 2 where the polymer medium is the tapping surface). In the probe-based data storage illustratively depicted, area density=1 Tb/in$^2$, SNR=7.95 (sufficient for 1e-4 error-rate in the raw data without error correction).

Figure 6:
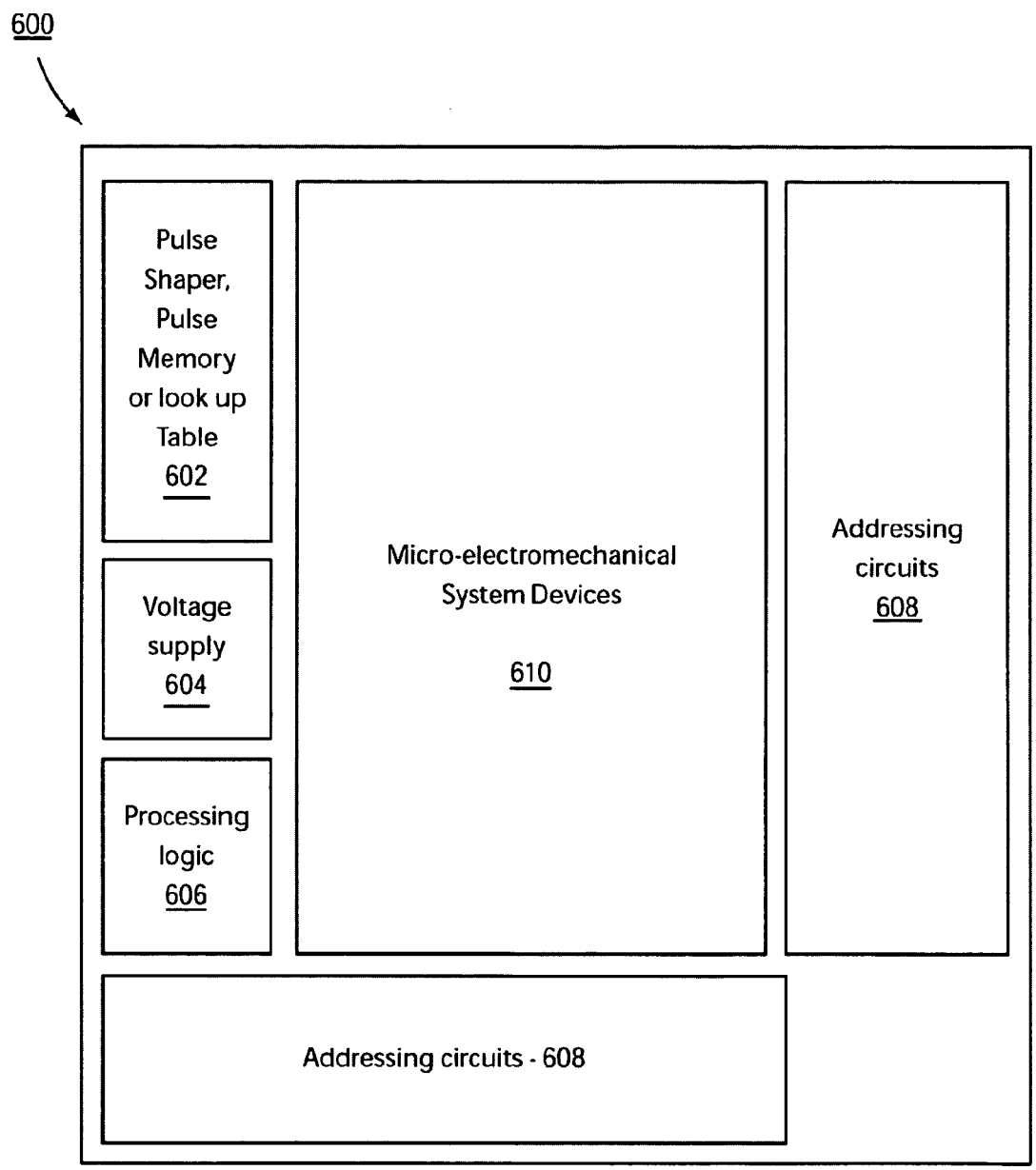
FIG. 6 is a diagram illustratively showing an integrated circuit layout of a MEMS array with an on-board pulse shaper in accordance with the present principles.

Referring to FIG. 6, an illustrative integrated circuit device 600 having an array of MEMS devices 610 is shown. The MEMS 610 are arranged in an array and may include any of a plurality of MEMS structures for performing different functions. The MEMS 610 may be addressed using addressing circuits 608 to selectively activate/deactivate individual MEMS devices. The MEMS devices in the array 610 may be powered using a voltage supply 604 and a pulse shaper 602 to provide a plurality of pulses to each device as described above. Given a finite set of pairs of initial and final positions of the MEMS devices, switching times and a final equilibrium voltage can be stored for each pair (additional intermediate voltages and positions are also contemplated). In general, the MEMS device can be operated in open loop by referring to a lookup table provided in block 602, which may include pulse information for different control commands or motions. The devices may also employ software programmed control or other techniques to control the motion of the devices. In the case of the array 610 of devices, the model mismatch is very small among each MEMS device when the devices are batch-fabricated. A single lookup table (602) can be used for each device when they are operated in parallel by considering a nominal model for all of the devices.

Processing logic 606 may be employed to assist in programming the lookup table adjusting the pulse shaper, performing addressing operations, etc. An actuation method may be based on principles of optimal control theory, and tailored to the MEMS devices using device dynamics. Faster operation is achievable independent of the design and applications of the specific device.

Figure 7:
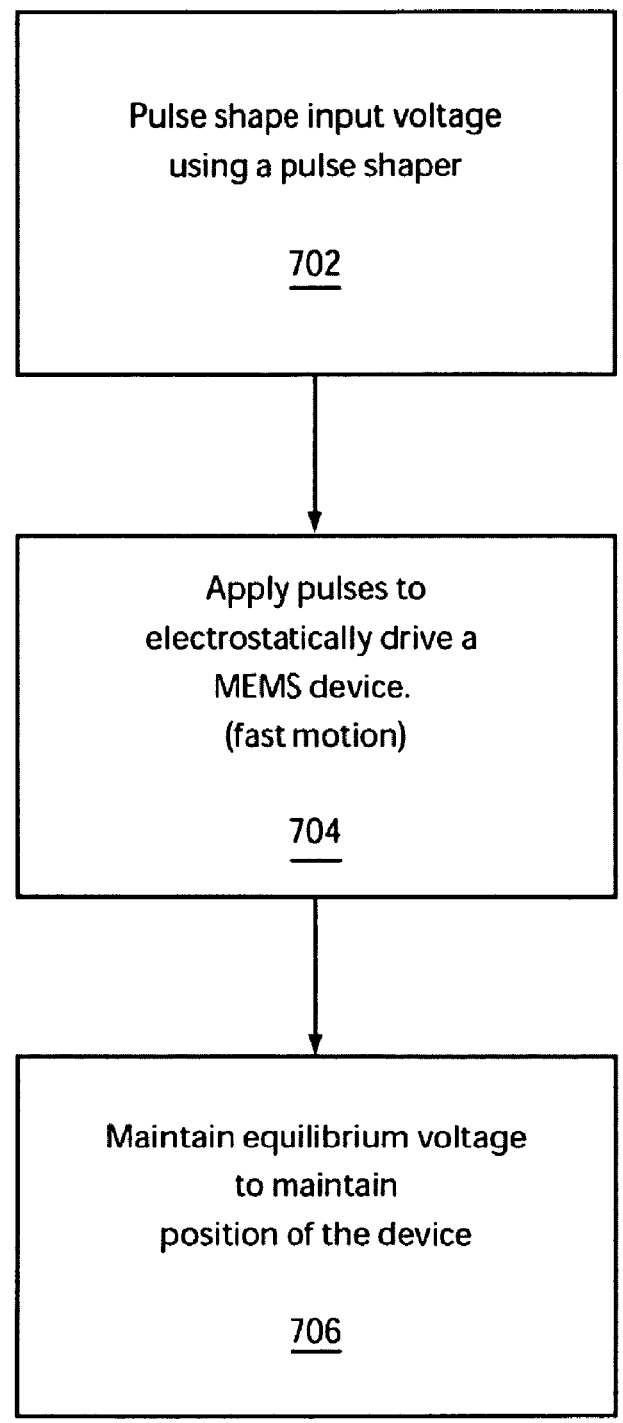
FIG. 7 is a block/flow diagram showing a system/method for actuating a MEMS device in accordance with the present principles.

Referring to FIG. 7, a system/method for actuating a micro-electromechanical device is illustratively depicted in accordance with one illustrative embodiment. In block 702, pulse shaping is performed on an input voltage using a pulse shaper configured to combine at least two different pulses to apply to at least one of a first structure and a second structure of the device. In block 704, the at least two different pulses are applied to electrostatically drive at least one of the first structure and the second structure between an initial position and a final position. In one embodiment, applying the at least two different pulses includes causing a velocity and position between the initial position and the final position to change exponentially (fast motion). At least one of the at least two different pulses may include a largest permitted input voltage magnitude for the device. The largest permitted input voltage magnitude may be equal to one of a maximum permitted input voltage and a minimum permitted input voltage. A first pulse of the at least two different pulses may be selected so that the first structure moves towards the final position when the first pulse is applied. A switching time of the different pulses is such that the first structure moves towards the final position while the velocity reduces to zero when the final position is reached. In block 706, the final position is maintained by applying an electrostatic equilibrium voltage.

Having described preferred embodiments for high-speed electrostatic actuation of MEMS-based devices (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A micro-electro mechanical device, comprising:
   a first structure;
   a second structure offset from the first structure by a gap wherein the first structure is configured to be electrostatically actuated to deflect relative to the second structure; and
   a pulse generator configured to superimpose at least two different pulses that are concurrently applied to electrostatically drive at least one of the first structure and the second structure between an initial position and a final position, wherein the at least two different pulses include a first pulse configured to control motion of the first structure and a second pulse configured to control transient deflections.

2. The device as recited in claim 1, wherein a velocity and position between the initial position and the final position change exponentially.

3. The device as recited in claim 1, wherein the final position is maintained with an electrostatically applied equilibrium voltage.

4. The device as recited in claim 1, wherein at least one of the at least two different pulses includes a largest input voltage magnitude for the device.

5. The device as recited in claim 4, wherein the largest input voltage magnitude is equal to one of a maximum input voltage and a minimum input voltage.

6. The device as recited in claim 1, wherein the first pulse of the at least two different pulses is selected so that the first structure moves towards the final position when the first pulse is applied.

7. The device as recited in claim 1, wherein a switching time of the different pulses is such that the first structure moves towards the final position while the velocity reduces to zero when the final position is reached.

8. A device having an array of micro-electro mechanical devices, comprising:
   an integrated circuit having a plurality of micro-electro mechanical devices formed thereon, the micro-electro mechanical devices including:
   a first structure;
   a second structure offset from the first structure by a gap wherein the first structure is configured to be electrostatically actuated to deflect relative to the second structure; and
   a pulse generator configured to superimpose at least two different pulses that are concurrently applied to electrostatically drive at least one of the first structure and the second structure between an initial position and a final position, wherein the at least two different pulses include a first pulse configured to control motion of the first structure and a second pulse configured to control transient deflections; and
   a controller configured to control activation of the plurality of micro-electro mechanical devices.

9. The device as recited in claim 8, wherein a velocity and position between the initial position and the final position change exponentially.

10. The device as recited in claim 8, wherein the final position is maintained with an electrostatically applied equilibrium voltage.

11. The device as recited in claim 8, wherein at least one of the at least two different pulses includes a largest input voltage magnitude for the device.

12. The device as recited in claim 11, wherein the largest input voltage magnitude is equal to one of a maximum input voltage and a minimum input voltage.

13. The device as recited in claim 8, wherein the first pulse of the at least two different pulses is selected so that the first structure moves towards the final position when the first pulse is applied.

14. The device as recited in claim 8, wherein a switching time of the different pulses is such that the first structure moves towards the final position while the velocity reduces to zero when the final position is reached.

15. A method for actuating a micro-electromechanical device, comprising:
   pulse shaping an input voltage using a pulse shaper configured to superimpose at least two different pulses that are concurrently applied to at least one of a first structure and a second structure of the device; and
   applying the at least two different pulses to electrostatically drive at least one of the first structure and the second structure between an initial position and a final position, wherein the at least two different pulses include a first pulse configured to control motion of the first structure and a second pulse configured to control transient deflections.

16. The method as recited in claim 15, wherein applying the at least two different pulses includes causing a velocity and position between the initial position and the final position to change exponentially.

17. The method as recited in claim 15, further comprising maintaining the final position by applying an electrostatic equilibrium voltage.

18. The method as recited in claim 15, wherein at least one of the at least two different pulses includes a largest input voltage magnitude for the device.

19. The method as recited in claim 18, wherein the largest input voltage magnitude is equal to one of a maximum input voltage and a minimum input voltage.

20. The method as recited in claim 15, wherein the first pulse of the at least two different pulses is selected so that a driven structure moves towards the final position when the first pulse is applied.

21. The method as recited in claim 15, wherein a switching time of the different pulses is such that the first structure moves towards the final position while the velocity reduces to zero when the final position is reached.

* * * * *